(12) United States Patent
Hong

(10) Patent No.: US 6,946,715 B2
(45) Date of Patent: Sep. 20, 2005

(54) CMOS IMAGE SENSOR AND METHOD OF FABRICATION

(75) Inventor: Sungkwon (Chris) Hong, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/367,825

(22) Filed: Feb. 19, 2003

(65) Prior Publication Data

US 2004/0161868 A1 Aug. 19, 2004

(51) Int. Cl.$^7$ ............................................... H01L 31/00
(52) U.S. Cl. ....................................... 257/440; 257/291
(58) Field of Search ................................. 257/440, 293

(56) References Cited

U.S. PATENT DOCUMENTS

| | | | |
|---|---|---|---|
| 3,860,956 A | 1/1975 | Kubo et al. | |
| 5,614,744 A | 3/1997 | Merrill | |
| 5,757,840 A | 5/1998 | Hiroki | |
| 5,945,722 A | 8/1999 | Tsuei et al. | |
| 5,965,875 A | 10/1999 | Merrill | |
| 6,066,510 A | 5/2000 | Merrill | |
| 6,140,630 A | 10/2000 | Rhodes | |
| 6,150,683 A | 11/2000 | Merrill et al. | |
| 6,204,524 B1 | 3/2001 | Rhodes | |
| 6,310,366 B1 | 10/2001 | Rhodes et al. | |
| 6,326,652 B1 | 12/2001 | Rhodes | |
| 6,330,113 B1 | 12/2001 | Slagle et al. | |
| 6,333,205 B1 | 12/2001 | Rhodes | |
| 6,376,868 B1 | 4/2002 | Rhodes | |
| 6,566,723 B1 * | 5/2003 | Vook et al. | .................. 257/440 |
| 6,606,120 B1 | 8/2003 | Merrill et al. | |
| 6,632,701 B2 | 10/2003 | Merrill | |
| 2002/0058353 A1 | 5/2002 | Merrill | |
| 2002/0149687 A1 * | 10/2002 | Jaspers | ........................ 348/273 |
| 2002/0171881 A1 | 11/2002 | Merrill et al. | |
| 2002/0190254 A1 | 12/2002 | Turner et al. | |
| 2003/0038296 A1 | 2/2003 | Merrill | |
| 2003/0128409 A1 * | 7/2003 | Vook et al. | .................. 358/513 |

FOREIGN PATENT DOCUMENTS

EP          1 006 585         6/2000

OTHER PUBLICATIONS

Keith M. Finlater, A CMOS Image Sensor With a Double–Junction Active Pixel; IEEE Transactions on Electron Devices, vol. 50, No. 1, Jan. 2003.

* cited by examiner

*Primary Examiner*—David Nelms
*Assistant Examiner*—Quoc Hoang
(74) *Attorney, Agent, or Firm*—Dickstein Shapiro Morin & Oshinsky LLP

(57) ABSTRACT

A CMOS imaging device including a two pixel detection system for red, green, and blue light. One pixel detects red and blue light and another pixel detects green light. The detection of red and blue is based on wavelength and the device is structured such that in the red/blue pixel, detection of blue light is at a shallow substrate depth, while detection of red is at a deeper substrate depth. The pixel array is structured such that the red/blue pixel is adjacent to the green pixel and alternates between red/blue and green pixels. The invention is also related to methods of forming such an imager array and pixels.

88 Claims, 14 Drawing Sheets

FIG. 2  PRIOR ART
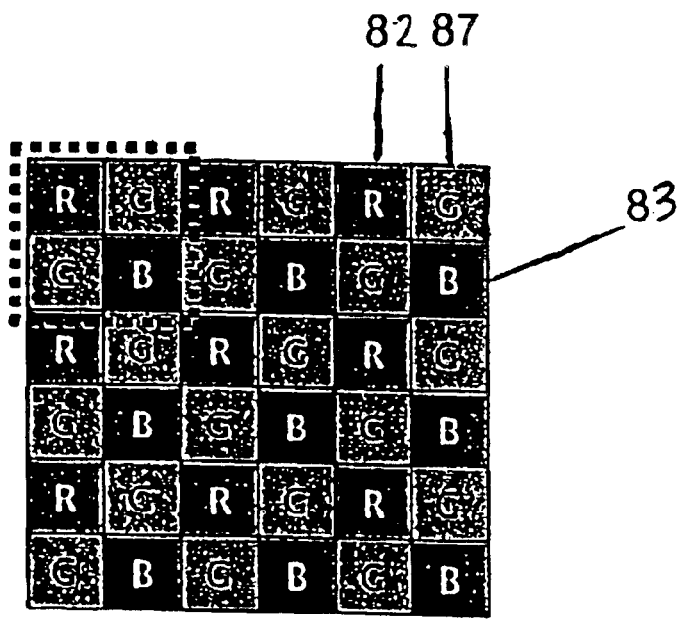
PRIOR ART
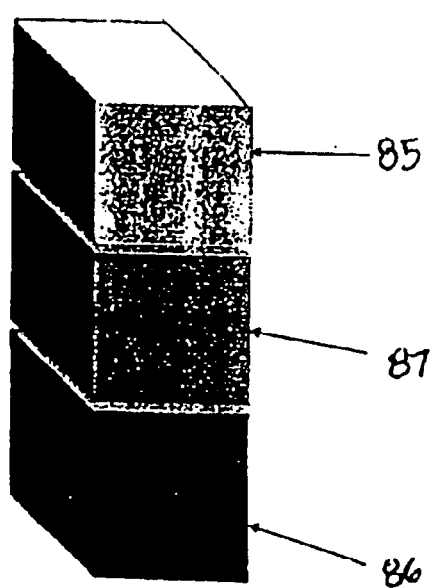
FIG. 3

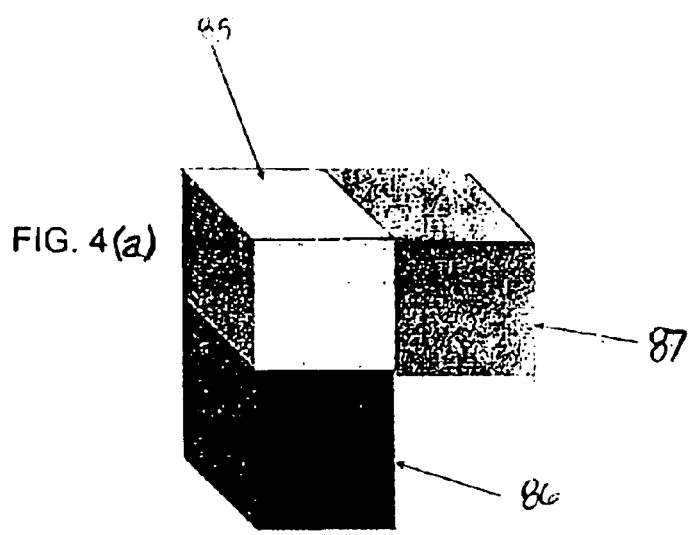
FIG. 4(a)
FIG. 4(b)
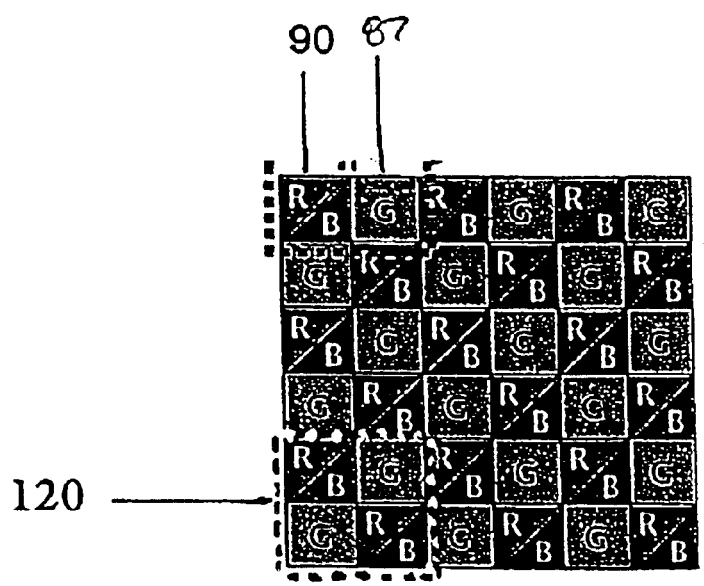

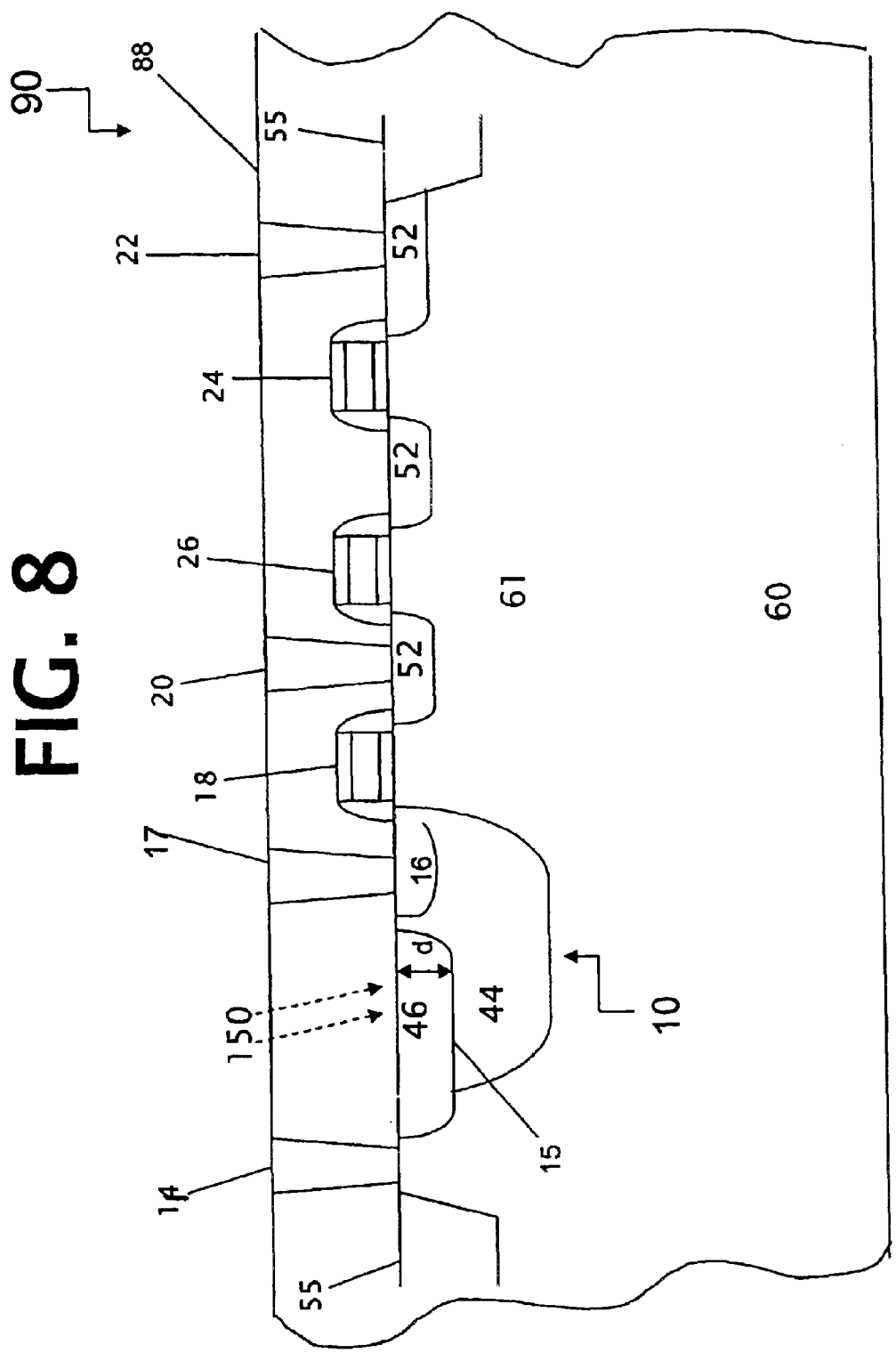

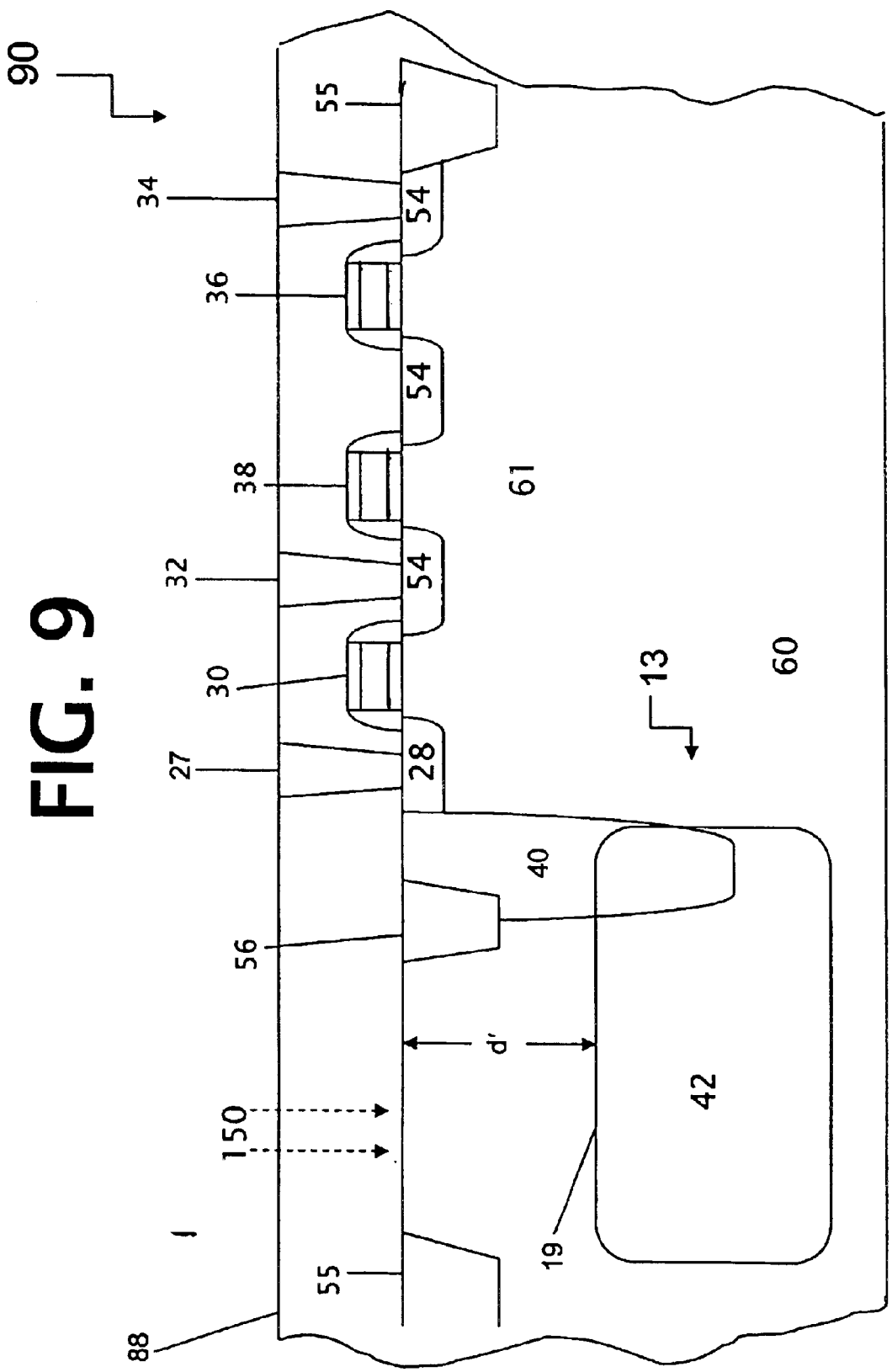

CMOS IMAGE SENSOR AND METHOD OF FABRICATION

FIELD OF THE INVENTION

The present invention relates generally to CMOS image color sensors and to methods of forming them.

BACKGROUND OF THE INVENTION

Typically, a CMOS imager circuit includes a focal plane array of pixel cells, each one of the cells including a photoconversion device, e.g. a photogate, a photoconductor, or a photodiode. A readout circuit connected to each pixel cell typically includes at least an output transistor. The photoconversion device converts photons to electrons which are typically transferred to a floating diffusion region, connected to the gate of a source follower output transistor. A charge transfer device can be included as well and may be a transistor for transferring charge from the photoconversion device to the floating diffusion region. Imager cells also typically have a transistor for resetting the floating diffusion region to a predetermined charge level prior to charge transference. The output of the source follower transistor is gated as an output signal by a row select transistor.

Exemplary CMOS imaging circuits, processing steps thereof, and detailed descriptions of the functions of various CMOS elements of an imaging circuit are described, for example, in U.S. Pat. No. 6,140,630 to Rhodes, U.S. Pat. No. 6,376,868 to Rhodes, U.S. Pat. No. 6,310,366 to Rhodes et al., U.S. Pat. No. 6,326,652 to Rhodes, U.S. Pat. No. 6,204,524 to Rhodes, and U.S. Pat. No. 6,333,205 to Rhodes. The disclosures of each of the forgoing are hereby incorporated by reference herein in their entirety.

FIG. 1 illustrates a block diagram of a CMOS imager device 308 having a pixel array 200 with each pixel cell being constructed as described above. Pixel array 200 comprises a plurality of pixels arranged in a predetermined number of columns and rows. The pixels of each row in array 200 are all turned on at the same time by a row selected line, and the pixels of each column are selectively output by respective column select lines. A plurality of rows and column lines are provided for the entire array 200. The row lines are selectively activated by the row driver 210 in response to row address decoder 220 and the column select lines are selectively activated by the column driver 260 in response to column address decoder 270. Thus, a row and column address is provided for each pixel. The CMOS imager is operated by the control circuit 250 which controls address decoders 220, 270 for selecting the appropriate row and column lines for pixel readout, and row and column driver circuitry 210, 260 which apply driving voltage to the drive transistors of the selected row and column lines. The pixel column signals, which typically include a pixel reset signal, $V_{rst}$ and a pixel image signal, $V_{sig}$, are read by a sample and hold circuit, 261, 262 associated with the column device 260 and a differential signal $V_{rst}$-$V_{sig}$ is produced for each pixel which is amplified and digitized by analog to digital converter 275. The analog to digital converter 275 converts the analog pixel signals received from the column driver 260 and its associated sample/hold circuits 261, 262 to digital signals which are fed to an image processor 280 to form a digital image.

A conventional CMOS image sensor pixel array usually follows a typical Bayer pattern as shown in FIG. 2 with one pixel for each of the colors red 82, green 87, and blue 83, respectively and arranged in a mosaic pattern as shown. Since there is only one pixel per color, the array requires a larger surface area. Another type of pixel, shown in FIG. 3, is a pixel which attempts to minimize array area by detecting all three colors at differing depths in a silicon substrate. See U.S. patent Publication No. 2002/0058353. One detriment of placing photoconversion regions for all three colors in one pixel is that the colors cannot, in practice, be completely separated and discerned by the stacked photoconversion regions, even when they are placed at optimal depths based on light wavelength. This incomplete color separation results in cross talk between adjacent color detection regions and poor quantum efficiency.

SUMMARY

The invention seeks to reduce array area while maintaining good color separation by providing one pixel cell for one color, e.g., the color green, and another combined pixel cell for two other colors, e.g., the red and blue colors. The pixel cell having the two colors has respective photoconversion devices at different depths into the substrate which are spaced from one another to reduce color crosstalk. The two color pixels are utilized in an array by positioning them adjacent to, and alternating with the single color pixels. Therefore, the area for basic color imaging is reduced to two pixels, instead of the conventional three pixels, while good color separation is achieved.

Additional features of the present invention will be apparent from the following detailed description and drawings which illustrate exemplary embodiments of the invention.

BRIEF DESCRIPTION OF THE DRAWINGS

FIG. 2 is a diagram representing a mosaic arrangement of a three color pixel array in a Bayer pattern;

FIG. 3 is a schematic diagram of a prior art pixel configuration of a pixel employing stacked color sensitive regions;

FIG. 4(a) is a schematic diagram of a two pixel layout in accordance with the invention;

FIG. 4(b) is a schematic diagram of a pixel array arranged in accordance with the invention;

FIG. 9 is a partial cross-sectional view of the 3T pixel depicted in FIG. 7, through line 9—9, with a red pixel sensor region depicted;

DETAILED DESCRIPTION

Figure 1:
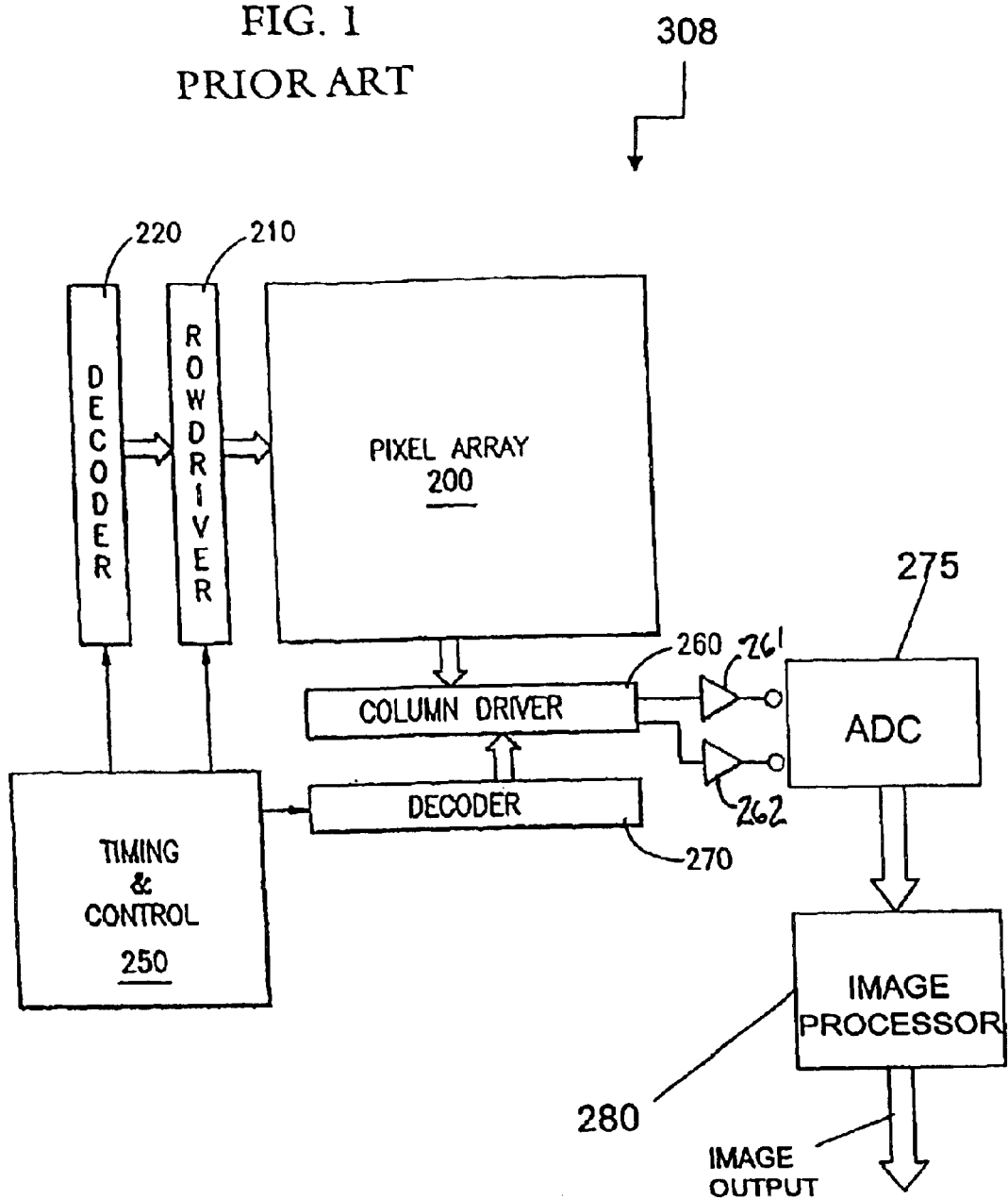
FIG. 1 is a block diagram of a conventional CMOS imager chip having a pixel array.

In the following detailed description, reference is made to the accompanying drawings, which form a part hereof and show by way of illustration specific embodiments in which the invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention. The progression of processing steps described is exemplary of embodiments of the invention; however, the sequence of steps is not limited to that set forth herein and may be changed as is known in the art, with the exception of steps necessarily occurring in a certain order.

The terms "wafer" and "substrate," as used herein, are to be understood as including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous processing steps may have been utilized to form regions, junctions, or material layers in or over the base semiconductor structure or foundation. In addition, the semiconductor need not be silicon-based, but could be based on silicon-germanium, germanium, gallium arsenide or other semiconductors.

The term "pixel," as used herein, refers to a photo-element unit cell containing a photoconversion device and associated transisitors for converting photons to an electrical signal. For purposes of illustration, a single representative two-color pixel and its manner of formation is illustrated in the figures and description herein; however, typically fabrication of a plurality of like pixels proceeds simultaneously. Accordingly, the following detailed description is not to be taken in a limiting sense, and the scope of the present invention is defined only by the appended claims.

Now referring to the figures, where like reference numbers designate like elements, FIG. 4(a) and FIG. 4(b) show a portion of a pixel array in accordance with the invention. FIG. 4(a) shows a representative pixel layout of two adjacent pixels, in accordance with the invention, with a blue color sensor 85 and a red color sensor 86 within the same pixel and a green color sensor in a separate pixel 87, positioned adjacent the red/blue pixel. FIG. 4(b) shows a pixel array using the FIG. 4(a) arrangement where one pixel 90 contains red/blue photo sensors 85, 86 and a second pixel 87 contains a green photo sensor. As shown in FIG. 4(b), the red/blue pixel 90 is arranged in a pattern alternating with and adjacent to an individual green pixel 87, in a "checkerboard" type pattern which can replace the conventional Bayer pattern array of FIG. 2. In accordance with the invention, only a two-pixel area is needed for color processing, thereby increasing the pixel array density.

Figure 5:
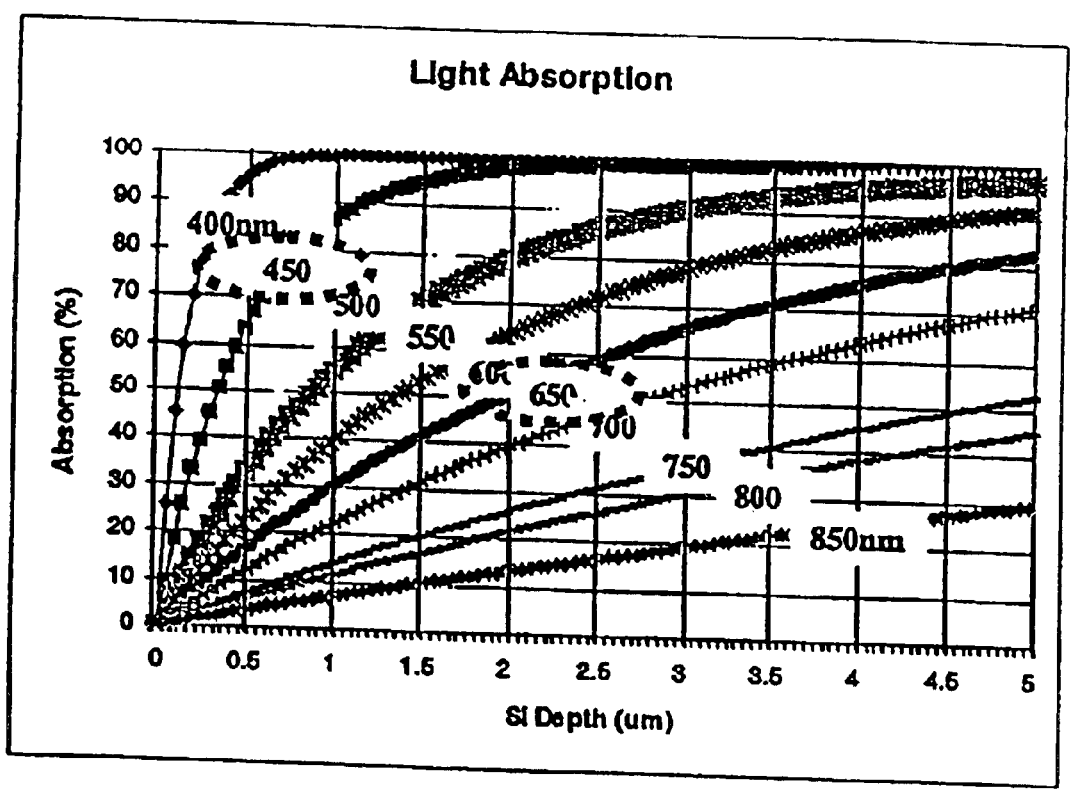
FIG. 5 is a graph showing light absorption v. substrate depth for different wavelengths of light.

FIG. 5 shows a characteristic of light absorption versus silicon substrate depth for different wavelengths of light. As shown in FIG. 5, blue light has a wavelength of around 450 nm and is optimally absorbed in silicon at a depth of about 0.5 $\mu$m to 1.0 $\mu$m. Green light having a wavelength of around 550 nm is optimally absorbed in silicon at a depth of about 1.5 $\mu$m. Red light has a wavelength of around 650 nm and is optimally absorbed at a substrate depth of greater than about 2.0 $\mu$m. As can be seen from FIG. 5, blue and green light are absorbed at depths which are relatively close to one another. Because of this, there is inevitably incomplete signal separation at the junction depths when three color photosensors are stacked above one another in the same pixel. This incomplete separation, particularly between the blue and green sensors results in cross talk and poor quantum efficiency.

The invention mitigates this problem by placing a blue color sensor 85 at a depth in the range of 0.5 $\mu$m to 1.0 $\mu$m from the surface of the substrate and a red color sensor 86 at a depth greater than 2 $\mu$m, below the blue sensor 80. The charge collection regions of these sensors are thus spaced apart by a region where no charge collection occurs. The green color sensor is formed in a separate pixel 87, described in connection with FIG. 4. The placement of the a blue color sensor 85 and a red color sensor 86 at differing depths with no color sensor between them results in mitigated cross talk and improved quantum efficiency.

Figure 6:
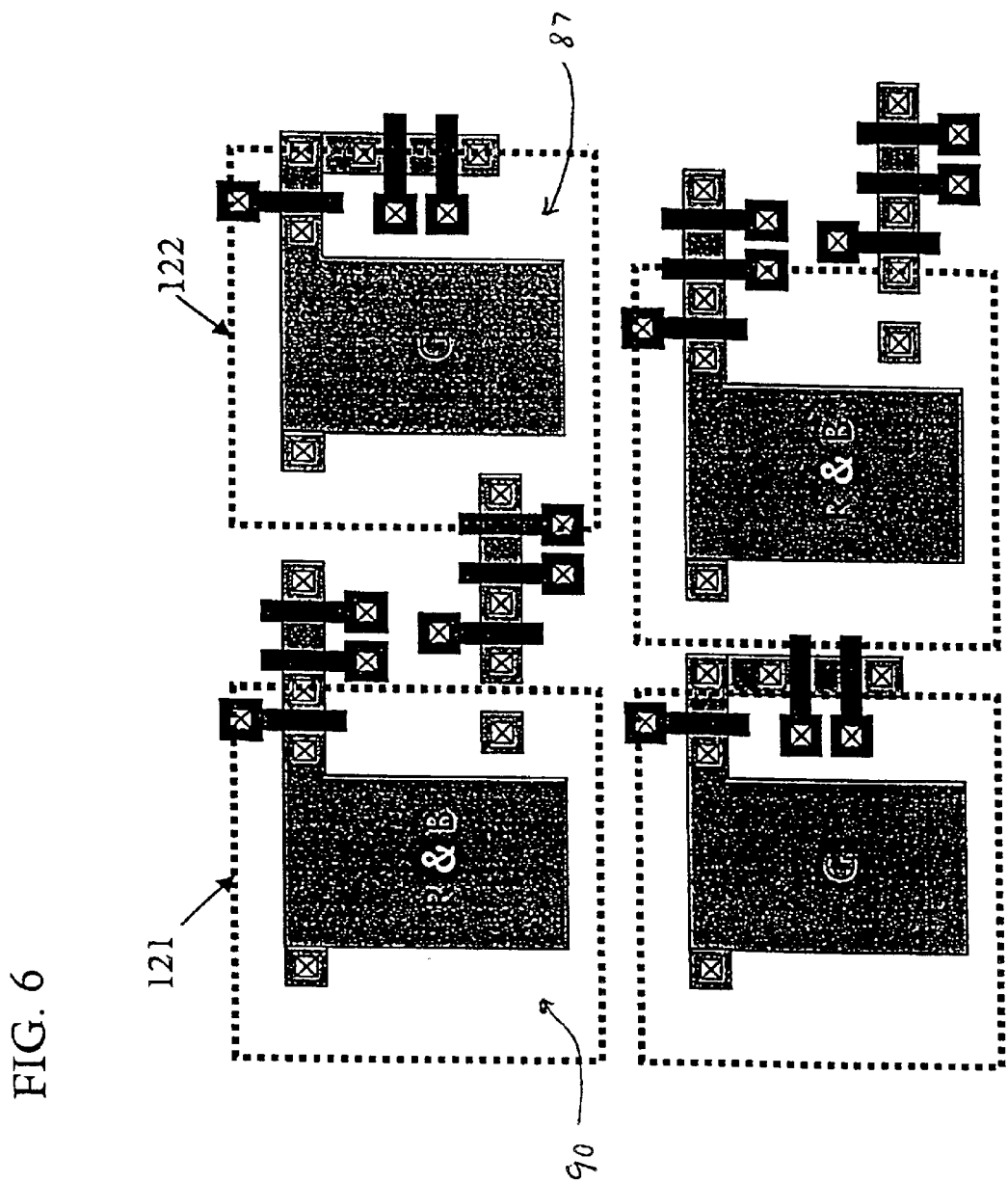
FIG. 6 is a top view of a portion of an integrated pixel array containing green and combined red/blue pixels in accordance with an exemplary embodiment of the invention.

FIG. 6 shows a top view of the two by two pixel array layout in accordance with an exemplary embodiment of the invention. The embodiment shown in FIG. 6 shows three transistor (3T) pixels in which three transistors are used in each pixel, however a four transistor (4T) embodiment with an added transfer transistor, can also be implemented in accordance with the invention as described below in connection with FIG. 10. Other pixel implementations using other pixel architectures may also be used with the invention. FIG. 6 also shows a blue/red filter 121 and a green filter 122 over the respective red/blue pixel cell 90 and green pixel cell 87.

Figure 7:
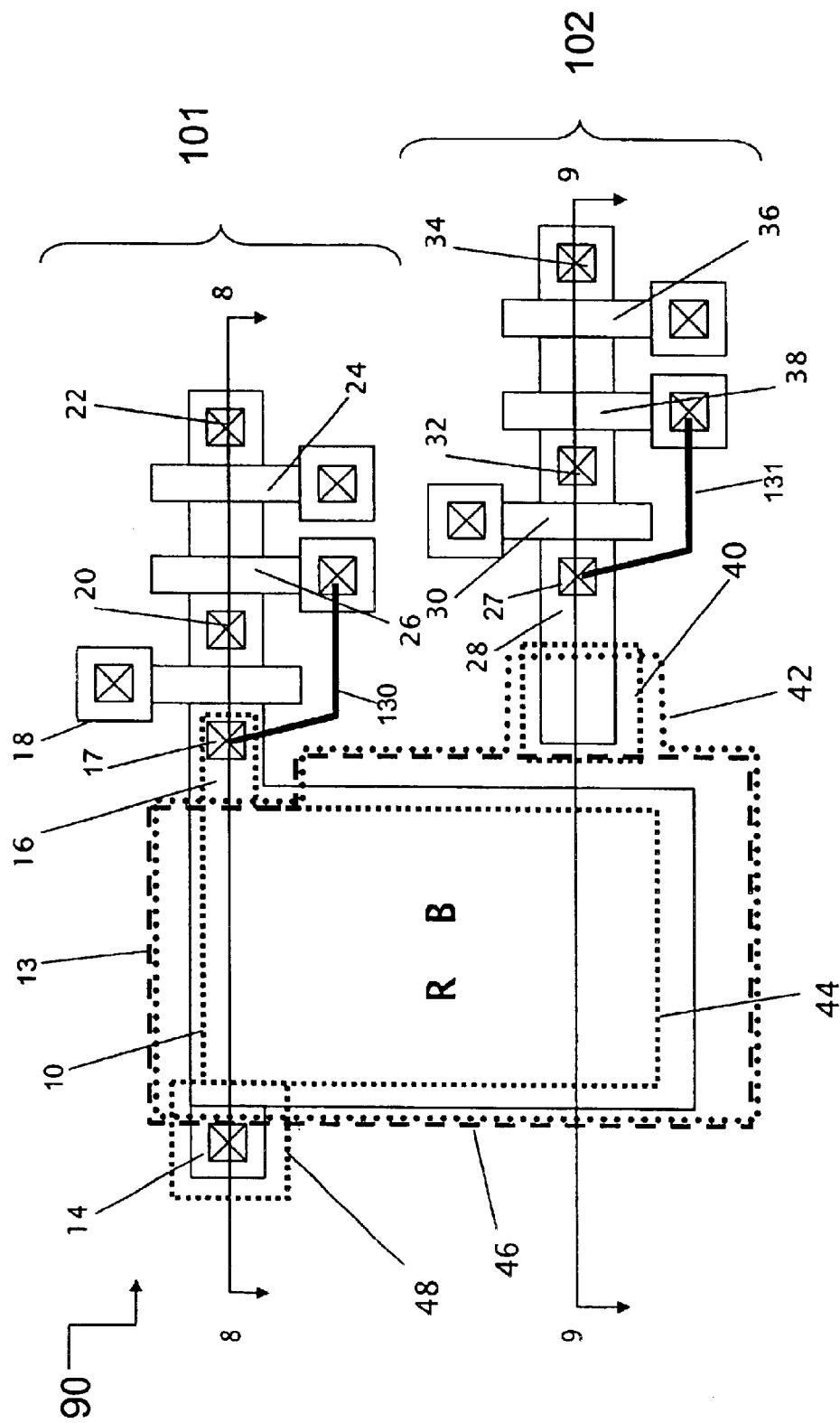
FIG. 7 shows a three transistor (3T) red/blue pixel in accordance with the invention.

FIG. 7 shows a top view of the 3T red/blue pixel cell of FIG. 6 in greater detail. The red/blue pixel cell 90 includes a blue photodiode 10 and an accompanying circuit, including a floating diffusion region 16, a reset transistor having a gate 18, a source follower transistor having a gate 26, and a row select transistor having a gate 24. A red photodiode 13 is below a blue photodiode 10. The circuit associated with the red photodiode 13 includes a floating diffusion region 28, a reset transistor having a gate 30, a source follower transistor having a gate 38, and a row select transistor having a gate 36. FIG. 7 shows the lateral extent of doped regions of the pixel 90. For exemplary purposes, these regions are doped as follows: a p+ upper doped region 46 (shown by hatched line), an n− upper doped region 44 (shown by square dotted line), an n− lower doped region 40 (shown by square dotted line), a p+ lower doped region 48 (shown by square dotted line) and an n− lower doped region 42 (shown by dotted line), each of which is also shown in greater detail in cross sections in FIG. 8 and FIG. 9. A ground terminal 14, voltage source terminal $V_{aa}$ 20, 32 and $V_{out}$ terminal 22, 34 are also shown in FIG. 7.

Figure 8:
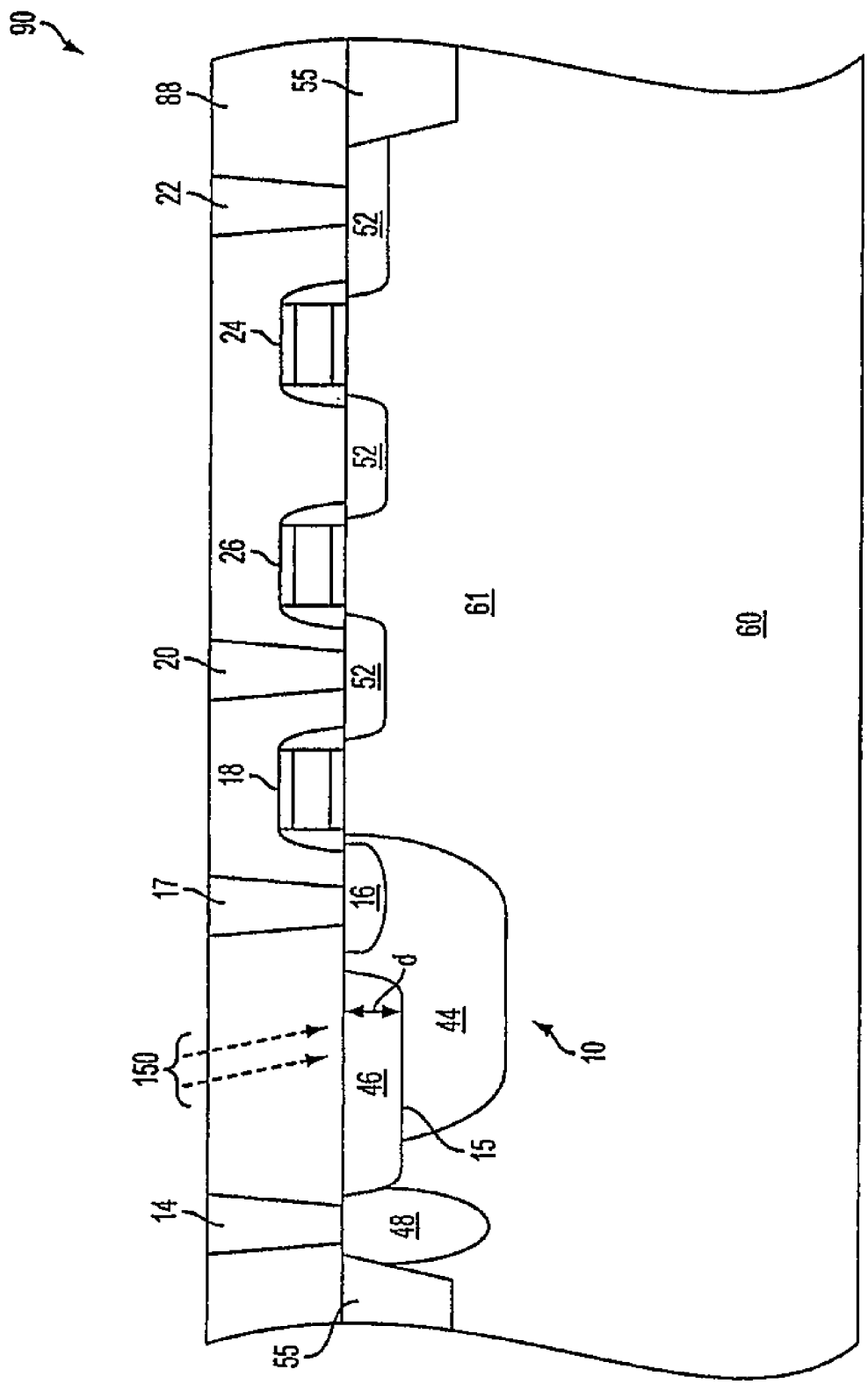
FIG. 8 is a partial cross-sectional view of the 3T pixel depicted in FIG. 7, through line 8—8, with a blue pixel sensor region depicted.
Figure 11:
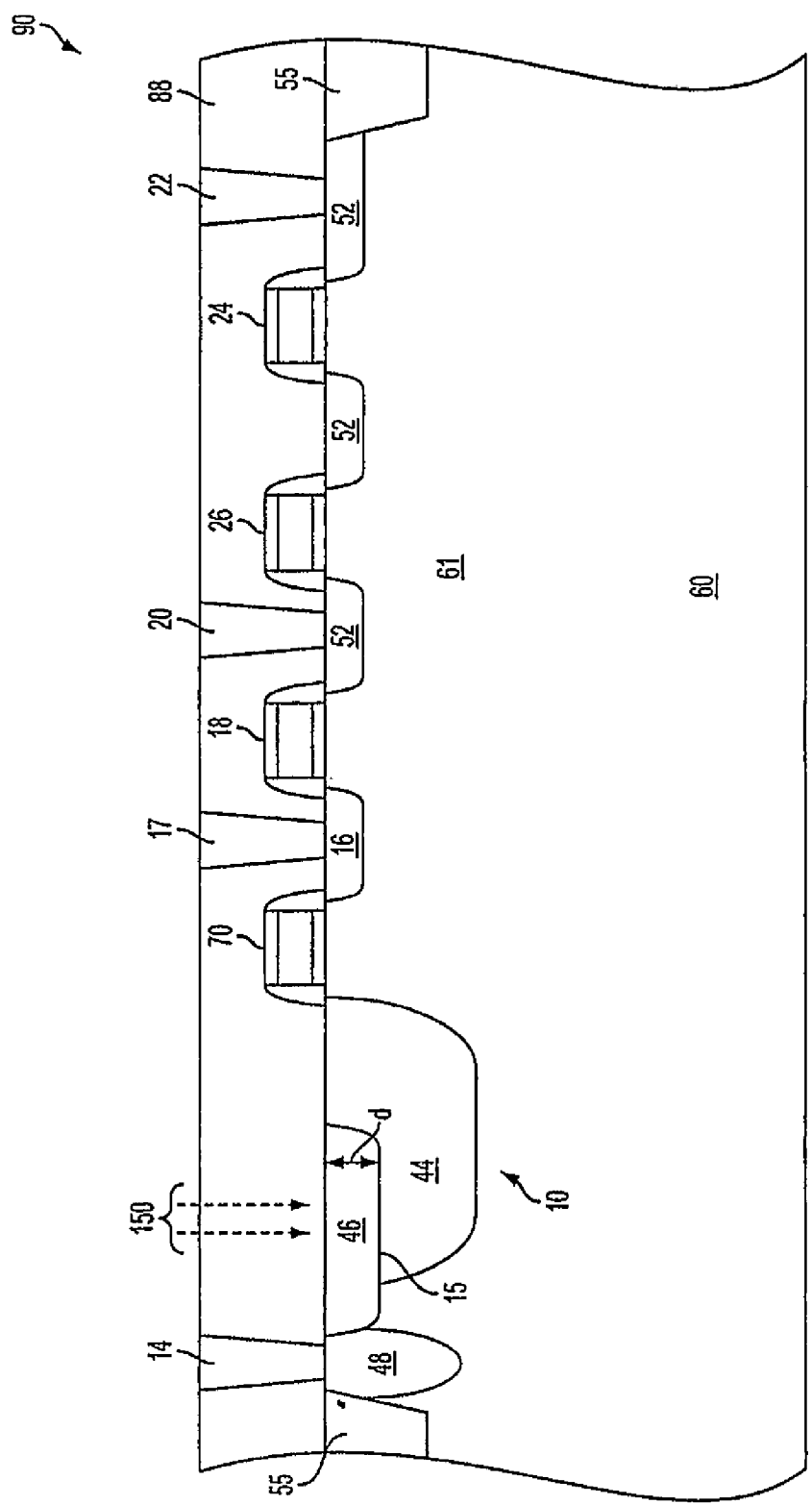

FIG. 8, shows a cross-section through line 8—8 of FIG. 7 for the blue sensor region. The p-n junction 15 of the blue sensor photodiode 10 of the red/blue pixel 90 is positioned at a depth d in the range of about 0.5 to about 1.0 $\mu$m from the top of the surface of substrate 60. For exemplary discussion, substrate 60 is a p-type substrate. A blue sensor is formed in a substrate 60 having a doped layer or well 61, which for exemplary purposes is also a p-type. The photoconversion device can be a photodiode 10. The photodiode 10 may be a p-n junction photodiode, a Schottky photodiode, or any other suitable photodiode, but for exemplary purposes is treated as a PIN photodiode and as shown in FIG. 8, is a photodiode consisting of a p+ region 46, an n− region 44, which are within p-well 61. The remaining structures shown in FIG. 8 include the reset transistor having a gate 18, source follower transistor having a gate 26, row select transistor having a gate 24 and blue output at contact 22. Floating diffusion region 16 is located below and around contact 17. A p+ region 48 connects the photodiode 10 to the ground circuit 14. Shallow trench isolation (STI) regions 55 which surround the red/blue pixel cell 90 are also shown.

FIG. 9 shows a partially cut-away cross-sectional view through line 9—9 of FIG. 7 and showing the red sensor region. The red sensor also employs a photodiode 13 and may be formed below the blue sensor photodiode 10 in the p-substrate 60 having the doped p-well 61. Like the blue sensor photodiode 10, the red photodiode 13 is a p-n junction photodiode, a Schottky photodiode, or any other suitable photodiode, but for exemplary purposes is treated as a PIN photodiode.

The red sensor photodiode 13 is positioned at a deeper junction depth than that of the blue sensor 10 based on the longer wavelength of red light, i.e., about 650 nm, and optimal silicon absorption of that wavelength. The red sensor cell p-n junction 19 is placed at a depth d' of greater than about 2.0 $\mu$m, and preferably greater than about 5.0 $\mu$m, from the surface of the substrate. The difference in depth between the photodiode 10 for the blue sensor and the photodiode 13 for the red sensor provides a physical separation for the diodes 10, 13 with no other color sensor region, for example, no green photodiode, between them and provides good color separation between the blue and red sensors with less crosstalk. The remaining structures shown in FIG. 9 include reset transistor having a gate 30, source follower transistor having a gate 38, row select transistor having a gate 36 and red output at contact 34. Floating diffusion region 28 is located below contact 27. An n– region 40 connects the red photodiode 13 n-type region 42 to floating diffusion region 28. A p+ region 48 connects the red photodiode 13 to the ground circuit 14. STI regions 55 are also shown which again isolate the pixel from adjacent pixels. In addition, an STI region 56 separates laterally the lower red photodiode from the upper blue photodiode of the combined red/blue pixel which also mitigates against blue charges passing into regions 40 or 28.

FIG. 7, FIG. 8 and FIG. 9 further show the source drain regions 52, 54, which are n+type for exemplary purposes, for the reset, source follower and row select transistors. The floating diffusion nodes 16 (FIG. 8) and 28 (FIG. 9) are connected to the source follower gates 26, 38 respectively, as shown in FIG. 7.

Figure 10:
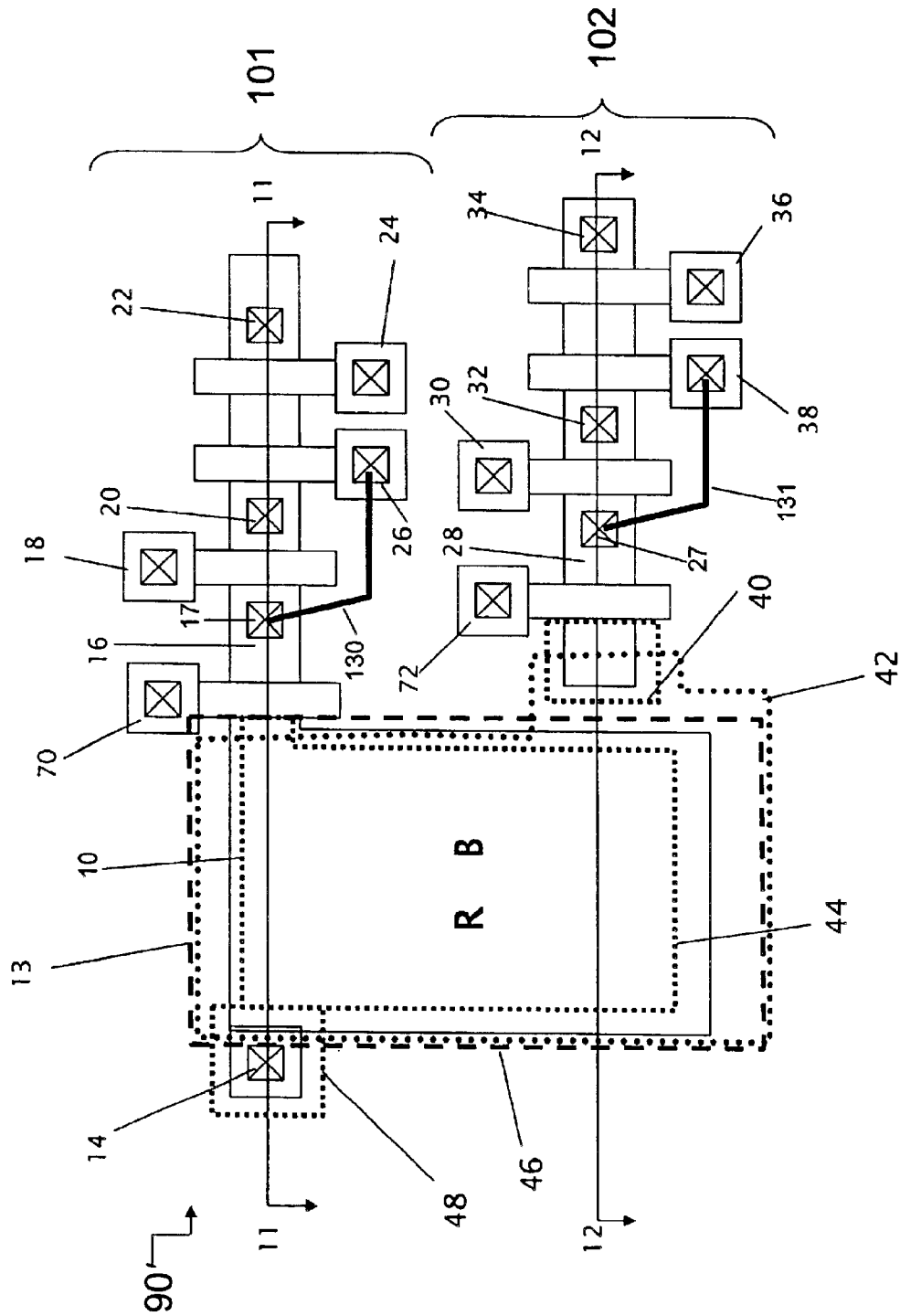
FIG. 10 shows a four transistor (4T) pixel in accordance with the invention.
Figure 11:
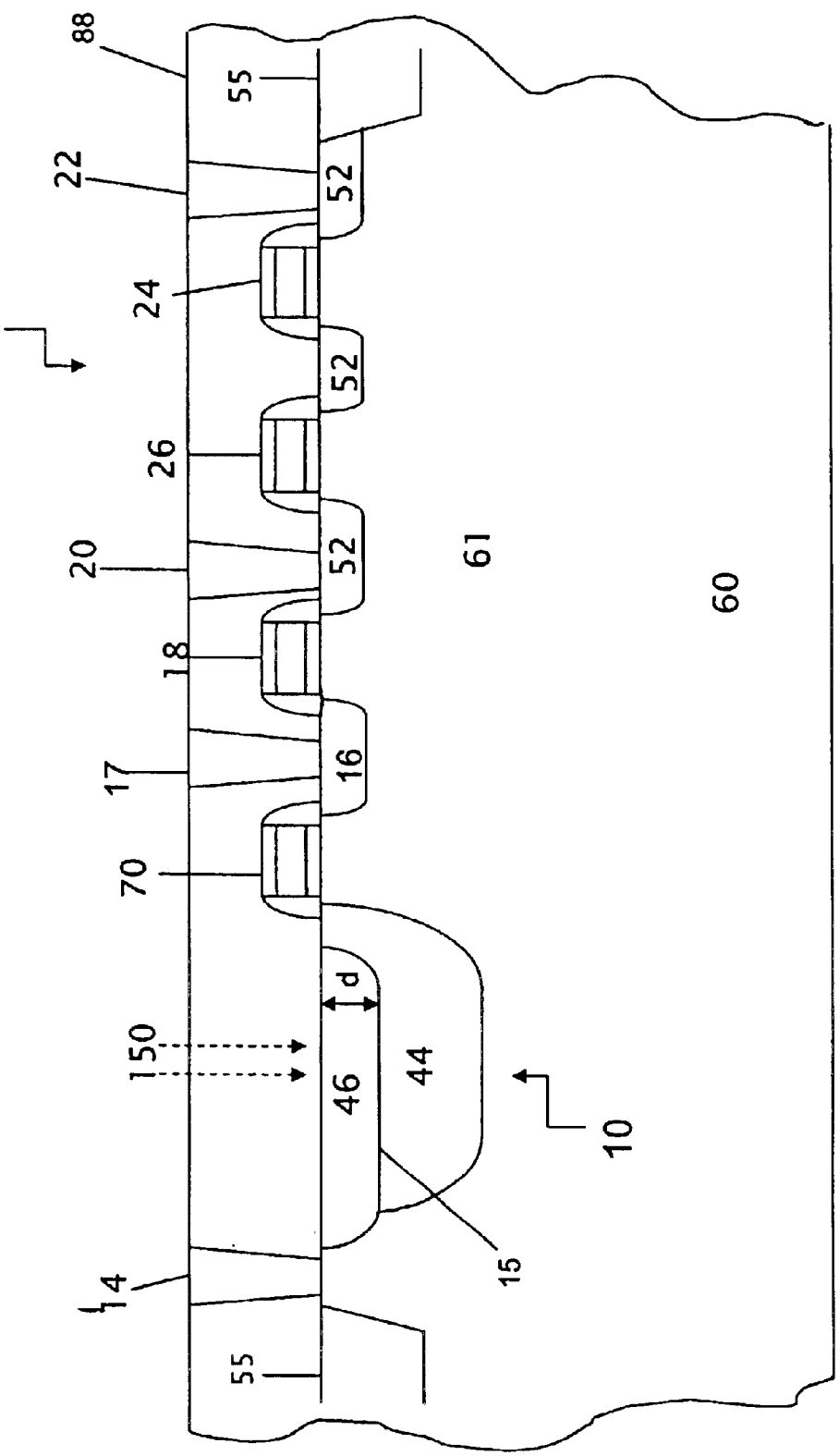
FIG. 11 is a partial cross-sectional view of the 4T pixel depicted in FIG. 10, through line 11—11, with a blue pixel sensor region depicted.
Figure 12:
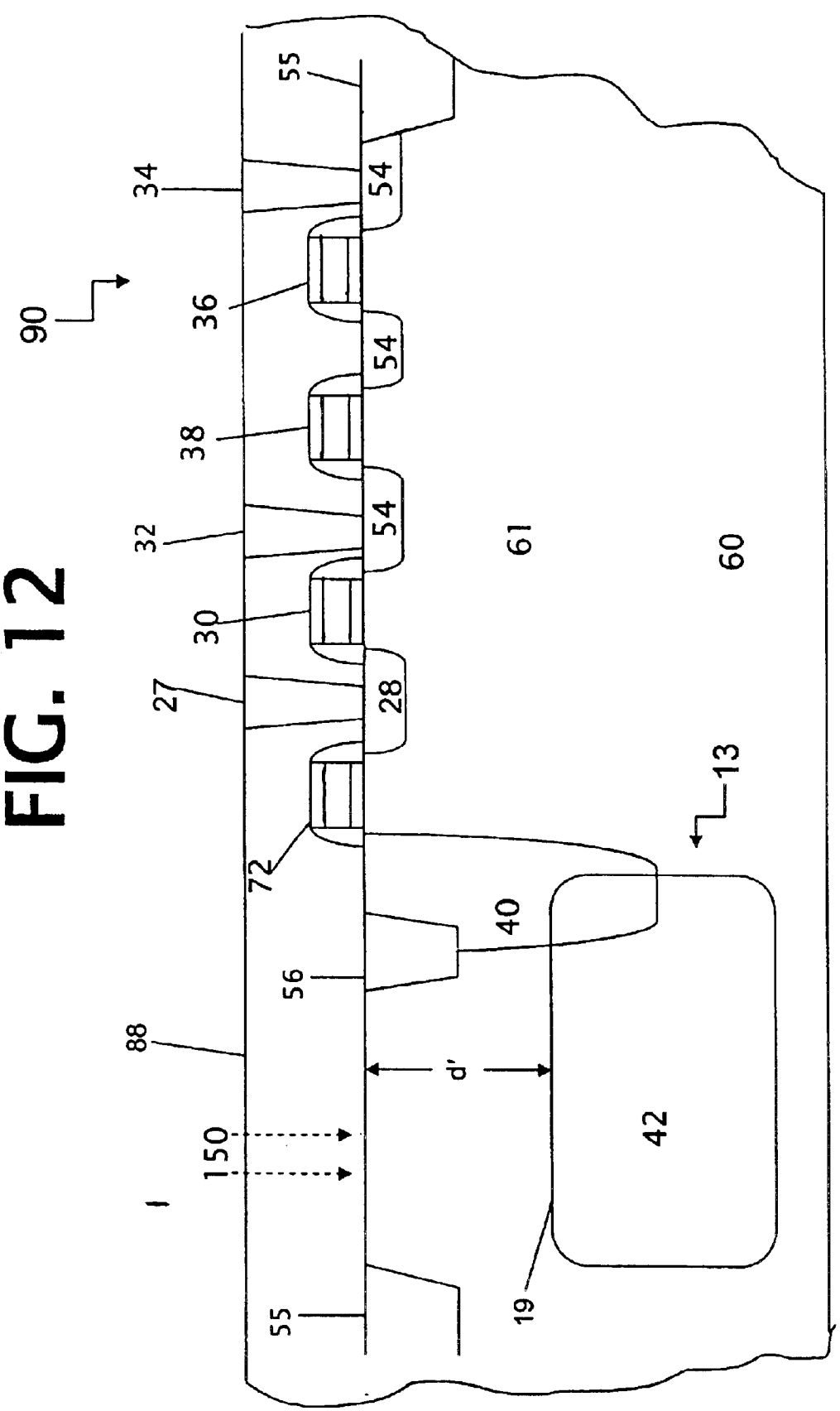
FIG. 12 is a partial cross-sectional view of the 4T pixel depicted in FIG. 10, through line 12—12, with a red pixel sensor region depicted.

FIG. 10 shows a top view of another embodiment of a red/blue pixel 90'. This embodiment is similar to that depicted in FIG. 7 with the exception of the addition of transfer transistors having associated gates 70, 72 which connect the n regions of photodiodes 10 and 13 to the respective floating diffusion regions 16 and 28. Likewise, FIG. 11 and FIG. 12 are also similar to FIG. 8 and FIG. 9 respectively, with the exception of the addition of a transfer transistors having gates 70, 72. The transfer transistor and associated gate 70 gates charges generated at the blue photodiode 10 to the floating diffusion region 16. Transfer transistor and associated gate 72 gates charge generated at the red photodiode 13 to floating diffusion region 28. In addition, although 3T and 4T pixels are shown as exemplary embodiments of the invention, other pixel circuit architectures having fewer or greater numbers of transistors can be used.

FIGS. 13–16 show one exemplary method of forming a 3T dual color pixel cell in accordance with the present invention at various stages of processing. For convenience, the invention will be described as formed in a p-well of a p-type substrate using a p/n photodiode as the photosensors; however the invention may also be formed in an n-well in an n-type substrate using an n/p photodiode, and other photosensor structures may also be used.

Figure 13:
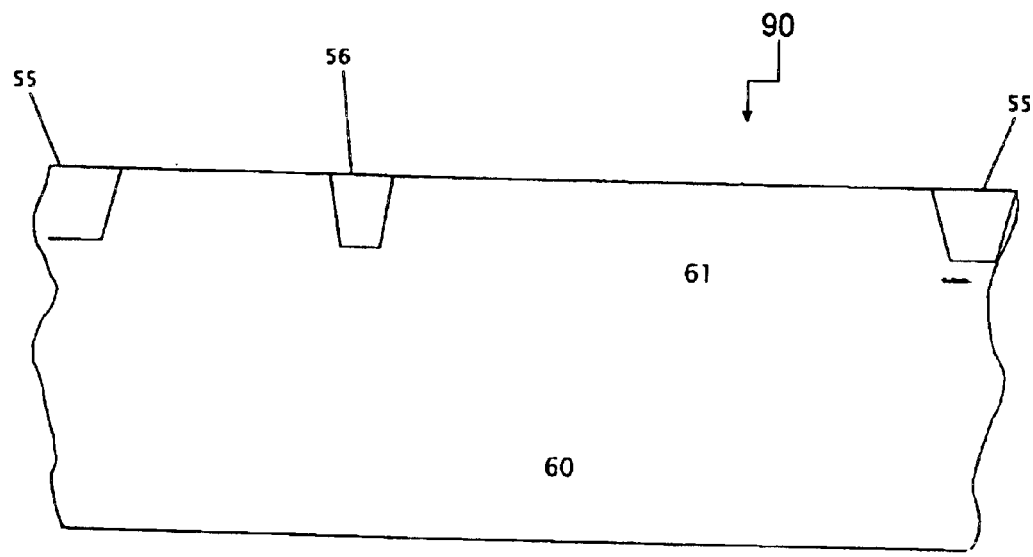
FIG. 13 through FIG. 16 show cross-sectional views of a portion of a semiconductor wafer during various stages of processing in accordance with the invention.

First a substrate 60, as shown in FIG. 13, is formed. This substrate 60 is a p-type silicon substrate as shown in FIG. 13 with a p-well 61 formed therein. The p-type well 61 may be formed before or after the formation of isolation regions 55, 56 in substrate 60. The p-well implant may be conducted so that the pixel array well 61 and a p-type periphery logic well, which will contain logic circuits for controlling the pixel array, have different doping profiles. As known in the art, multiple high energy implants may be used to tailor the profile of the p-type well 61.

Isolation regions 55, 56 also shown in FIG. 13, are formed to electrically isolate regions of the substrate where pixel cells will later be formed. The isolation regions 55, 56 can be formed by any known technique such as thermal oxidation of the underlying silicon in a LOCOS process, or by etching trenches and filling them with oxide in an STI (shallow trench isolation) process. Following formation of isolation regions 55, 56 if the p-type well 61 has not yet been formed, it may then be formed by blanket implantation or by masked implantation to produce the p-type well 61. Isolation region 56 laterally separates the blue photodiode 10 from the floating diffusion region 28 of red photodiode 13.

Figure 14:
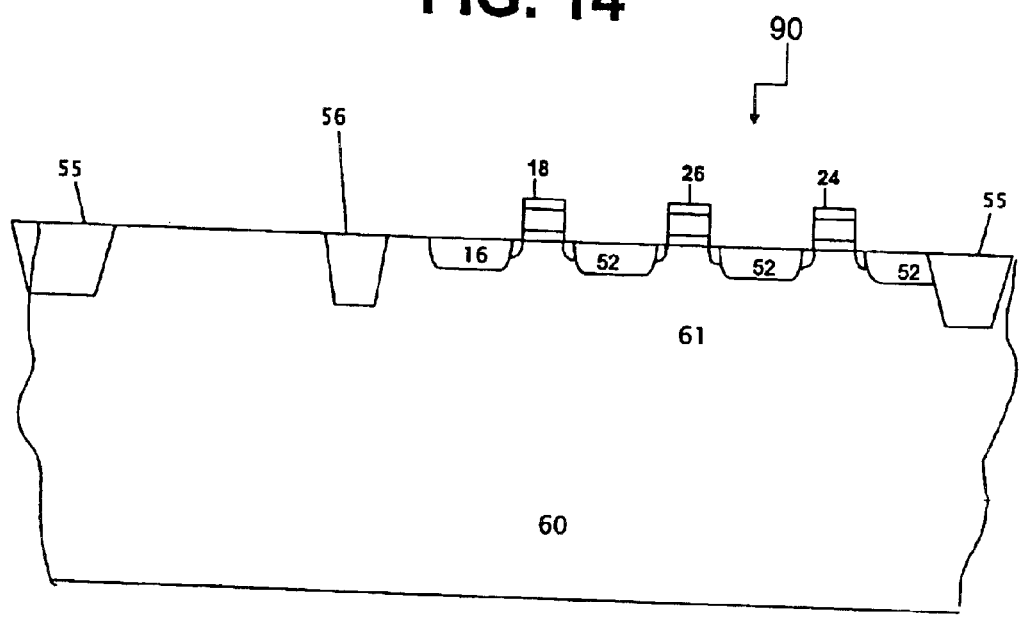

Next the circuitry of the pixel sensor cell 90, including the transfer gates 70, 72; reset transistor gates 18, 30; the source follower transistor gates 26, 38; and the row select transistor gates 24, 36 are formed by well-known methods, e.g., blanket deposition of gate oxide, doped polysilicon, deposition of metal for a silicide nitride annealing to form a silicide, then patterning and etching. FIG. 14 shows an exemplary embodiment with formed gate stacks for reset transistor 18, source follower transistor 26, and row select transistor 24.

Floating diffusion regions 16, 28 and source/drain regions 52, 54 are also formed after the gate stacks. Doped regions 52, shown in FIG. 14, are formed in the p-well 61 and are doped to an n-type conductivity. For exemplary purposes, doped regions 52, are n+ doped and may be formed by applying a mask to the substrate and doping the region 52 by ion implantation. After source/drain region implants are formed, the gate stack sidewall insulators are then formed on the sides of the gate stacks using known techniques.

Figure 15:
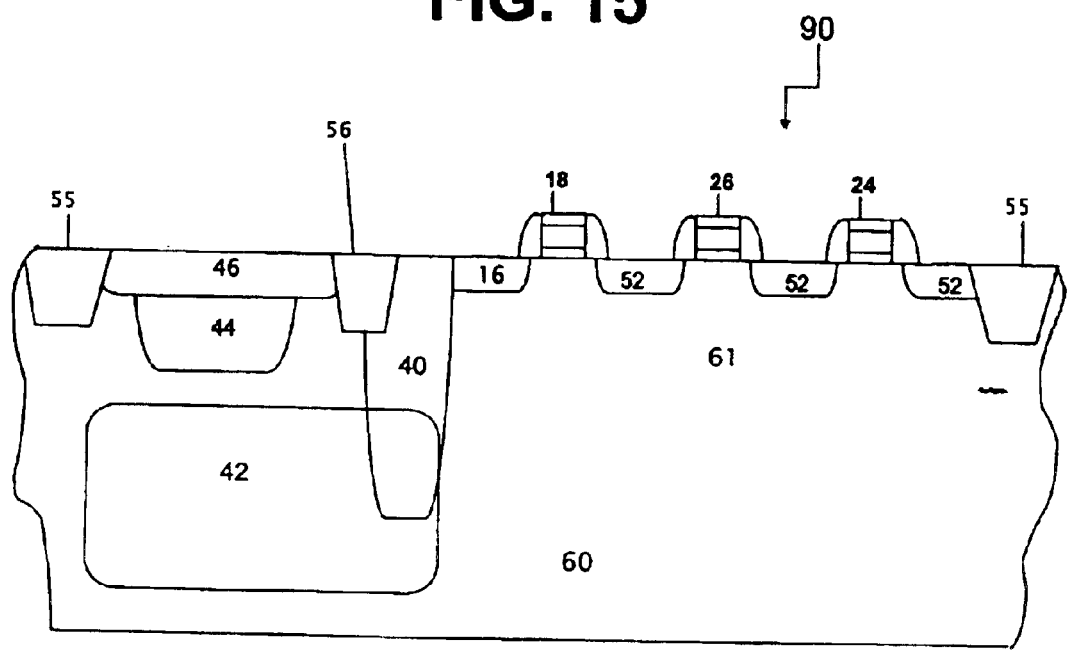

FIG. 15 shows implantation of the n-type regions 40, 42 to form the red photodiode 13. FIG. 15 also shows the implantation of the blue photodiode 10 regions, p+ region 46 and n– region 44 by methods known in the art. FIG. 15 also shows the insulating sidewalls added to the gate stacks for reset transistor 18, source follower transistor 26, and row select transistor 24.

Figure 16:
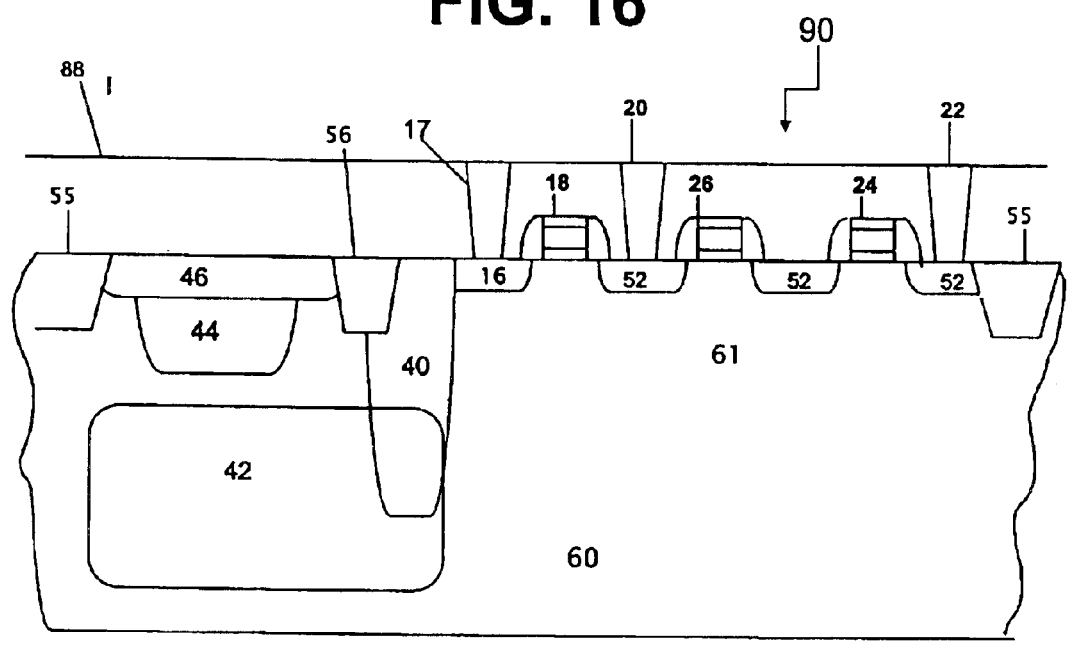

The pixel sensor cells 10, 13 are essentially complete at this stage, and conventional processing methods may be used to form insulating, shielding, and metallization layers to connect gate lines and other connections to the pixel sensor cells. For example, the entire surface may be covered with a passivation layer 88 of, for example, silicon dioxide, BSG, PSG, or BPSG, which is CMP planarized and etched to provide contact holes, which are then metallized to provide contacts. FIG. 16 shows conductive plugs 17, 20 and 22 which are formed in an insulating layer 88, which may be BPSG, applied over the gate stacks. The conductive plugs 17, 20 and 22 connect to active areas, providing contacts for $V_{aa}$ 20 and $V_{out}$ 22 to the pixel circuitry. Conventional layers of conductors and insulators may also be used to interconnect the structures and to connect the pixel to peripheral circuitry.

As shown in FIGS. 8, 9, 11, and 12, as light radiation 150 strikes the photodiodes, photo-energy is converted to electrons, for example, which are stored in the n-regions of the photodiodes 10, 13 and transferred to the floating diffusion regions 16 and 28. This transfer may occur as the electrons are formed in the 3T embodiment or may occur as a gated transfer using the transfer transistor in the 4T embodiment (FIGS. 11, 12).

The green pixel 87 is shown in FIGS. 4(a) and 4(b). The green pixel sensor cells are formed using conventional processing techniques used to form conventional pixel cells.

Figure 17:
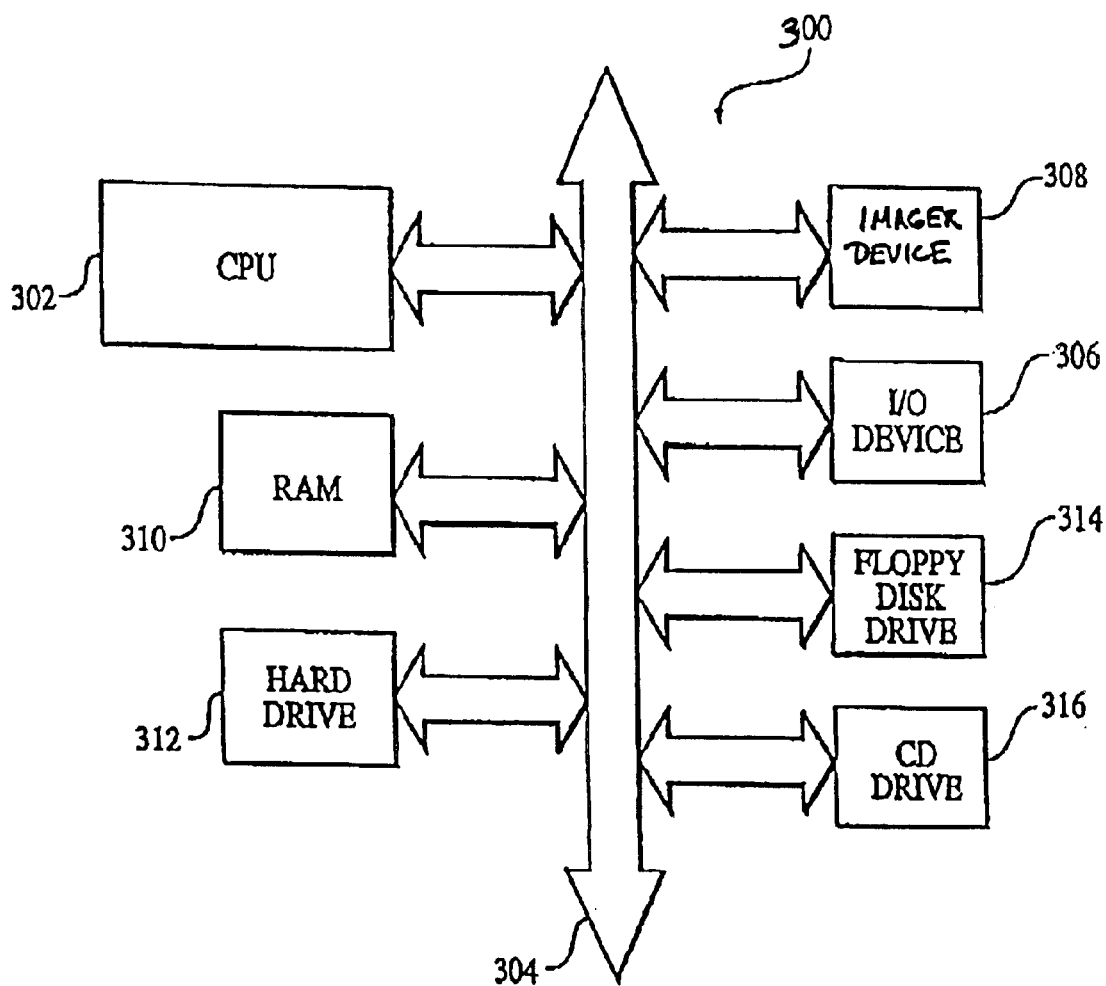
FIG. 17 is a schematic diagram of a processing system which employs a CMOS imager having a pixel array in accordance with the present invention.

FIG. 17 shows a processor system 300, which includes an imager device 308 (FIG. 1) but having an image array containing red/blue pixels, arrayed with green pixels, in accordance with the invention. The imager device 308 may receive control or other data from system 300. System 300 includes a processor 302 having a central processing unit (CPU) that communicates with various devices over a bus 304. Some of the devices connected to the bus 304 provide communication into and out of the system 300; an input/output (I/O) device 306 and imager device 308 are such communication devices. Other devices connected to the bus 304 provide memory, illustratively including a random access memory (RAM) 310, hard drive 312, and one or more peripheral memory devices such as a floppy disk drive 314 and compact disk (CD) drive 316. The imager device 308 may be constructed as shown in FIG. 1 with the pixel array 200 having the characteristics of the invention as described above in connection with FIGS. 4–16. The imager device 308 may, in turn, be coupled to processor 302 for image processing, or other image handling operations. Examples of processor based systems, which may employ the imager device 308, include, without limitation, computer systems, camera systems, scanners, machine vision systems, vehicle navigation systems, video telephones, surveillance systems, auto focus systems, star tracker systems, motion detection systems, image stabilization systems, and others.

The processes and devices described above illustrate preferred methods and typical devices of many that could be used and produced. The above description and drawings illustrate embodiments, which achieve the objects, features, and advantages of the present invention. However, it is not intended that the present invention be strictly limited to the above-described and illustrated embodiments. Any modifications, though presently unforeseeable, of the present invention that come within the spirit and scope of the following claims should be considered part of the present invention.

What is claimed as new and desired to be protected by Letters Patent of the United States is:

1. A two color pixel comprising:
   a substrate having a surface;
   a first color component photoconversion device located below the surface of said substrate at a first absorption depth for a first wavelength of light; and
   a second color component photoconversion device located below the surface of said substrate at a second absorption depth for a second wavelength of light;
   wherein said first color component photoconversion device and said second color component photoconversion device overlap vertically within said substrate such that the first color component photoconversion device is located closer to the surface of the substrate than the second color component photoconversion device and said first and second color component photoconversion devices are spaced apart vertically by a region of said substrate which does not produce photogenerated charges; and
   a two-color output processing circuit respectively coupled to said first and second color component photoconversion devices, said processing circuit being configured to output signals corresponding to respective charges produced by said first and second color component photoconversion devices.

2. The two color pixel of claim 1 wherein said first and second color component photoconversion devices are photodiodes.

3. The two color pixel of claim 2 wherein said first and second photodiodes are PIN photodiodes.

4. The two color pixel of claim 1 wherein said first color component photoconversion device is a blue light sensor.

5. The two color pixel of claim 4 wherein said blue light sensor has a p-n junction located at a depth of from about 0.5 $\mu$m to about 1.0 $\mu$m from a top surface of the substrate.

6. The two color pixel of claim 1 wherein said second color component photoconversion device is a red light sensor.

7. The two color pixel of claim 6 wherein said red light sensor has a p-n junction located at a depth of about 2.0 $\mu$m or greater from a top surface of the substrate.

8. The two color pixel of claim 6 wherein said red light sensor has a p-n junction located at a depth of about 5.0 $\mu$m or greater from a top surface of the substrate.

9. The two color pixel of claim 1 further comprising an isolation region for minimizing lateral charge transfer of charges generated by said first color component photoconversion device into a region in said substrate which receives charges generated by said second color component photoconversion device.

10. The two color pixel of claim 9 wherein said isolation region is a shallow trench isolation region.

11. The two color pixel of claim 1 wherein said first color component photoconversion device is part of a four transistor pixel circuit comprising a transfer transistor, a reset transistor, a source follower transistor and a row select transistor.

12. The two color pixel of claim 11, wherein said first color component photoconversion device further comprises a doped region that is configured to receive charge transferred from the first color component photoconversion device.

13. The two color pixel of claim 12, wherein said doped region is doped n+.

14. The two color pixel of claim 12, wherein said doped region is a floating diffusion region.

15. The two color pixel of claim 12, further comprising a transfer gate configured to gate charge between said first color component photoconversion device and said doped region.

16. The two color pixel of claim 1 wherein said second color component photoconversion device is part of a four transistor pixel circuit comprising a transfer transistor, a reset transistor, a source follower transistor and a row select transistor.

17. The two color pixel of claim 16, wherein said second color component photoconversion device further comprises a first doped region configured to receive charge transferred from the second color component photoconversion device.

18. The two color pixel of claim 17, wherein said first doped region is doped n−.

19. The two color pixel of claim 17 wherein said first doped region connects said second color component photoconversion device to a second doped region configured to receive charge transferred from the second photoconversion device.

20. The two color pixel of claim 19 wherein said second doped region is doped n+.

21. The two color pixel of claim 19 wherein said second doped region is a floating diffusion region.

22. The two color pixel of claim 19, wherein said second color component photoconversion device comprises a transfer gate configured to gate charge between said second photoconversion device and said second doped region.

23. The two color pixel of claim 1 wherein said first color component photoconversion device is part of a three transistor pixel circuit comprising a reset transistor, a source follower transistor, and a row select transistor.

24. The two color pixel of claim 23 wherein charges generated by said first color component photoconversion device are transferred to a doped region.

25. The two color pixel of claim 24 wherein said doped region is doped n+.

26. The two color pixel of claim 24 wherein said doped region is a floating diffusion region.

27. The two color pixel of claim 1 wherein said second color component photoconversion device is part of a three transistor pixel circuit comprising a reset transistor, a source follower transistor, and a row select transistor.

28. The two color pixel of claim 27, wherein said second color component photoconversion device comprises a first doped region configured to receive charge transferred from the second color component photoconversion device.

29. The two color pixel of claim 28 wherein said first doped region is doped n−.

30. The two color pixel of claim 28 wherein said first doped region connects said second color component photoconversion device to a second doped region configured to receive charge transferred from the second color component photoconversion device.

31. The two color pixel of claim 30 wherein said second doped region is doped n+.

32. The two color pixel of claim 30 wherein said second doped region is a floating diffusion region.

33. The two color pixel of claim 1 wherein a doped region connects said first color component photoconversion device to a ground circuit.

34. The two color pixel of claim 33 wherein said doped region is a p+ doped region.

35. The two color pixel of claim 1 wherein a doped region connects said second color component photoconversion device to a ground circuit.

36. The two color pixel of claim 35 wherein said doped region is a p+ doped region.

37. The two color pixel of claim 1 wherein said first and second color component photoconversion devices comprise respective charge generating regions that are not coincident in size when viewed from the top.

38. The two color pixel of claim 37 wherein said respective charge generating region of the first color component photoconversion device occupies a smaller area than said respective charge generating region of the second color component photoconversion device when viewed from the top.

39. The two color pixel of claim 1 wherein doped said first and second color component photoconversion devices comprise respective charge generating regions that are not coincident in shape when viewed from the top.

40. An array of pixel sensor cells comprising:
a substrate having a top surface and comprising a plurality of first and second pixels arranged into an array of rows and columns;
said first pixel comprising a first color component photoconversion device located below the top surface of said substrate at a first depth corresponding to a first absorption depth for a first wavelength of light and a second color component photoconversion device located below the top surface of said substrate at a second depth corresponding to a second absorption depth for a second wavelength of light;
said first color component photoconversion device and said second color component photoconversion device overlapping vertically within said substrate such that the first color component photoconversion device is located closer to the top surface of the substrate than the second color component photoconversion device and said first and second color component photoconversion devices are spaced from one another by a region of said substrate which does not produce photogenerated charges; and
wherein said second pixel comprises a third color component photoconversion device for a third wavelength of light.

41. The array of claim 40 wherein said first pixel senses red and blue colors of light.

42. The array of claim 40 wherein said first color component photoconversion device is a blue light sensor.

43. The array of claim 42 wherein said blue light sensor has a p-n junction located at a depth of from about 0.5 $\mu$m to about 1.0 $\mu$m from the top surface of the substrate.

44. The array of claim 40 wherein said second color component photoconversion device is a red light sensor.

45. The array of claim 44 wherein said red light sensor has a p-n junction located at a depth of about 2.0 $\mu$m or greater from the top surface of the substrate.

46. The array of claim 44 wherein said red light sensor has a p-n junction located at a depth of about 5.0 $\mu$m or greater from the top surface of the substrate.

47. The array of claim 40 further comprising an isolation region for minimizing lateral charge transfer of charges generated by said first color component photoconversion device into a region in said substrate which receives charges generated by said second color component photoconversion device.

48. The array of claim 40 wherein a doped region connects said first color component photoconversion device to a ground circuit.

49. The array of claim 48 wherein said doped region is a p+ doped region.

50. The array of claim 40 wherein a doped region connects said second color component photoconversion device to a ground circuit.

51. The device array of claim 50 wherein said doped region is a p+ doped region.

52. The array of claim 40 wherein said first and second color component photoconversion devices comprise respective charge generating regions that are not coincident in size when viewed from the top.

53. The array of claim 52 wherein said respective charge generating region of the first color component photoconversion device occupies a smaller area than said said respective charge generating region of the second color component photoconversion device when viewed from the top.

54. The array of claim 40 wherein said first and second color component photoconversion devices comprise respective charge generating regions that are not coincident in shape when viewed from the top.

55. The array of claim 40 wherein each said second pixel senses green color of light.

56. The array of claim 40 wherein said first and second pixels are arranged in a checkerboard pattern.

57. An imaging system comprising:
an array of pixel cells arranged in rows and columns, each said pixel cell being configured to generate at least one voltage at a diffusion node responsive to detected light intensity by the cell, said array of pixel cells comprising a plurality of first pixel cells and a plurality of second pixel cells, said first and second pixel cells being arrayed in an alternating pattern in said array;
each of said first pixel cells comprising a first color component photoconversion device located below the surface of a substrate at a first depth corresponding to a first absorption depth for a first wavelength of light and a second color component photoconversion device located below the surface of said substrate at a second depth corresponding to a second absorption depth for a second wavelength of light;
said first color component photoconversion device and said second color component photoconversion device overlapping vertically within said substrate such that the first color component photoconversion device is located closer to the surface of the substrate than the second color component photoconversion device, said first and second color component photoconversion devices being vertically spaced from one another by a region of said substrate which does not produce photogenerated charges; and
wherein each of said second pixel cells comprises a third color component photoconversion device for a third wavelength of light.

58. The system of claim 57 wherein each said first pixel cell senses red and blue colors of light.

59. The system of claim 57 wherein said first color component photoconversion device is a blue light sensor.

60. The system of claim 59 wherein said blue light sensor has a p-n junction located at a depth of from about 0.5 $\mu$m to about 1.0 $\mu$m from a top surface of the substrate.

61. The system of claim 57 wherein said second color component photoconversion device is a red light sensor.

62. The system of claim 61 wherein said red light sensor has a p-n junction located at a depth of about 2.0 $\mu$m or greater from a top surface of the substrate.

63. The system of claim 61 wherein said red light sensor has a p-n junction located at a depth of about 5.0 $\mu$m or greater from a top surface of the substrate.

64. The system of claim 57 wherein each second pixel senses a green color of light.

65. The system of claim 57 further comprising an isolation region configured to prevent lateral transfer of charges generated by said first color component photoconversion device into a region in said substrate which receives charges generated by said second color component photoconversion device.

66. The system of claim 57 wherein a doped region connects said first color component photoconversion device to a ground circuit.

67. The system of claim 66 wherein said doped region is a p+ doped region.

68. The system of claim 57 wherein a doped region connects said second color component photoconversion device to a ground circuit.

69. The system of claim 68 wherein said doped region is a p+ doped region.

70. The system of claim 57 wherein said first and second color component photoconversion devices comprise respective charge generating regions that are not coincident in size when viewed from the top.

71. The system of claim 70 wherein said respective charge generating region of the first color component photoconversion device occupies a smaller area than said respective charge generating region of the second color component photoconversion device when viewed from the top.

72. The system of claim 57 wherein said first and second color component photoconversion devices comprise respective charge generating regions that are not coincident in shape when viewed from the top.

73. An imager device, comprising:
a doped layer formed in a substrate;
an array of first and second pixel cells formed in said doped layer;
wherein each of said first pixel cells comprises a first color component photoconversion device located below the surface of said substrate at a first depth corresponding to a first absorption depth for a first wavelength of light and a second color component photoconversion device located below the surface of said substrate at a second depth corresponding to a second absorption depth for a second wavelength of light;
wherein said first color component photoconversion device and said second color component photoconversion device overlap vertically within said substrate such that the first color component photoconversion device is located closer to the surface of the substrate than the second color component photoconversion device and said first and second color component photoconversion devices are vertically spaced from one another by a region of said substrate which does not produce photogenerated charges; and
wherein each of said second pixel cells comprises a third color component photoconversion device for a third wavelength of light.

74. The imager device of claim 73 wherein each said first pixel cell senses red and blue colors of light.

75. The imager device of claim 73 wherein said first color component photoconversion device is a blue light sensor.

76. The imager device of claim 75 wherein said blue light sensor has a p-n junction located at a depth of from about 0.5 $\mu$m to about 1.0 $\mu$m from a top surface of the substrate.

77. The imager device of claim 73 wherein said second color component photoconversion device is a red light sensor.

78. The imager device of claim 77 wherein said red light sensor has a p-n junction located at a depth of about 2.0 $\mu$m or greater from a top surface of the substrate.

79. The imager device of claim 77 wherein said red light sensor has a p-n junction located at a depth of about 5.0 $\mu$m or greater from a top surface of the substrate.

80. The imager device of claim 73 wherein each said second pixel senses green color of light.

81. The imager device of claim 73 further comprising an isolation region configured to prevent lateral transfer of charges generated by said first color component photoconversion device into a region in said substrate which receives charges generated by said second color component photoconversion device.

82. The imager device of claim 73 wherein a doped region connects said first color component photoconversion device to a ground circuit.

83. The imager device of claim 82 wherein said doped region is a p+ doped region.

84. The imager device of claim 73 wherein a doped region connects said second color component photoconversion device to a ground circuit.

85. The imager device of claim 84 wherein said doped region is a p+ doped region.

86. The imager device of claim 73 wherein said first and second color component photoconversion devices comprise respective charge generating regions that are not coincident in size when viewed from the top.

87. The imager device of claim 86 wherein said respective charge generating regions of the first color component photoconversion device occupies a smaller area than said respective charge generating region of the second color conversion photoconversion device when viewed from the top.

88. The imager device of claim 73 wherein said first and second color component photoconversion devices comprise respective charge generating regions that are not coincident in shape when viewed from the top.

* * * * *

UNITED STATES PATENT AND TRADEMARK OFFICE
CERTIFICATE OF CORRECTION

PATENT NO. : 6,946,715 B2
DATED : September 20, 2005
INVENTOR(S) : Chris S. Hong It is certified that error appears in the above-identified patent and that said Letters Patent is hereby corrected as shown below:

Title page,
Item [56], References Cited, OTHER PUBLICATIONS,
"Keith M. Finlater, A CMOS Image Sensor With a Double-Junction Active Pixel; IEEE Transactions on Electron Devices, vol. 50, No. 1, Jan. 2003." should read
-- Keith M. Findlater, A CMOS Image Sensor With a Double-Junction Active Pixel; IEEE Transactions on Electron Devices, vol. 50, No. 1, Jan. 2003. --.

Column 1,
Line 1, "CM OS" should read -- CMOS --.

Column 5,
Line 56, "of a transfer" should read -- of transfer --.

Column 9,
Line 64, "wherein doped said" should read -- wherein said --.

Column 10,
Line 55, "the device array" should read -- The array --.
Line 63, "than said said" should read -- than said --.

Signed and Sealed this

Fourteenth Day of February, 2006

JON W. DUDAS
*Director of the United States Patent and Trademark Office*

UNITED STATES PATENT AND TRADEMARK OFFICE
CERTIFICATE OF CORRECTION

PATENT NO. : 6,946,715 B2
APPLICATION NO. : 10/367825
DATED : September 20, 2005
INVENTOR(S) : Chris S. Hong It is certified that error appears in the above-identified patent and that said Letters Patent is hereby corrected as shown below:

In the Drawings
Replace Figures 8 and 11 with the attached Replacement Sheets.

Signed and Sealed this

Eighteenth Day of September, 2007

JON W. DUDAS
*Director of the United States Patent and Trademark Office*